United States Patent
Fowler

[11] 4,023,088
[45] May 10, 1977

[54] RADIATION-TO-A.C. CONVERTER

[75] Inventor: Herbert H. Fowler, P.O. Box 11431, Lexington, Ky. 40511

[73] Assignee: White, Letcher T., Manchester, Ky.

[22] Filed: July 23, 1975

[21] Appl. No.: 598,230

[52] U.S. Cl. .................................. 322/2 R; 310/2; 310/4 R; 310/3 C; 350/160 LC; 318/127; 318/128; 307/308

[51] Int. Cl.² .................................. H02N 00/00

[58] Field of Search ............... 310/2, 3 R, 3 C, 3 A, 310/3 B, 4, 10; 322/2; 307/308; 350/160 LC; 318/127, 128, 132; 325/376

[56] References Cited
UNITED STATES PATENTS

| 685,953 | 11/1901 | Tesla | 325/376 |
|---|---|---|---|
| 1,640,393 | 8/1927 | Coblentz | 322/2 |
| 2,548,225 | 4/1951 | Linder | 322/2 X |
| 2,919,358 | 12/1959 | Marrison | 310/2 X |
| 3,287,659 | 11/1966 | Ancker-Johnson | 307/308 X |
| 3,562,613 | 2/1971 | Adler et al. | 310/3 C |
| 3,925,785 | 12/1975 | Firtiou et al. | 318/127 X |

Primary Examiner—Donovan F. Dugga
Attorney, Agent, or Firm—Stanley J. Price, Jr.; David H. Hill

[57] ABSTRACT

A radiation-to-electrical energy converter in which transmission of radiation from a radiation source is controlled by radiation gates to alternate the build up of positive potential on a pair of radiant energy absorbers and in which the positive potentials on the absorbers are employed to produce an alternating current. The radiation gates are liquid crystals which are specially constructed to pass radiation when in an un-energized state.

7 Claims, 2 Drawing Figures

RADIATION-TO-A.C. CONVERTER

FIELD OF INVENTION

This invention relates to radiation-to-electrical energy converters and is particularly concerned with a novel generator or conversion device which employs radiant energy to produce an electric current.

BACKGROUND

The present invention employs the known principle of irradiating an electrically conductive body to positively charge the body. This principle is employed in U.S. Pat. No. 685,953, which issued to N. Tesla on Nov. 5, 1901, to charge a capacitor.

In Tesla, a single conductive body or plate is subjected to irradiation from a radiation source to place a charge of a single pre-selected polarity on a capacitor. The capacitor is periodically discharged by a mechanically operated switch to produce a pulsating direct current.

SUMMARY AND OBJECTS OF INVENTION

The present invention fundamentally differs from Tesla's conversion device in that two electrically conductive bodies (hereinafter called radiant energy absorbers or simply absorbers) are employed and are alternately subjected to maximum irradiation in such a manner to create useful alternating current.

The absorbers in this invention are alternately exposed to maximum radiation from a suitable radiation source by employing a pair of radiation gates. One radiation gate is positioned between one of the absorbers and the radiation source and the other radiation gate is positioned between the other absorber and radiation source. Each of the radiation gates has two alternate states, one which permits passage or transmission of the radiation rays and the other which blocks transmission of the radiation rays. The two radiation gates alternate between the two states in such a manner that when one is clear to transmit radiation to its associated absorber, the other is opaque to block transmission to its associated absorber. A switching circuit controlling the states of the gates employs the positive voltages developed on the absorbers to establish the alternating current.

In the preferred embodiment the radiation gates are advantageously in the form of liquid crystals. Liquid crystals have the property of turning from a clear state to an opaque or cloudy state upon passing a current through them as described, for example, in the February, 1972 issue of Radio-Electronics. Instead of employing glass to form the liquid crystal's envelope or cell as is customary, however, other material, such as quartz, is employed in this invention so that the envelope itself does not block or reflect the radiation rays. When constructed in this manner, the liquid crystals are effective radiation gates in that they block transmission of radiation rays in their cloudy or opaque state, but permit passage of the radiation rays in their clear state.

In the preferred embodiment, alternating current is produced. Direct current, if desired, may be obtained by employing a rectifier.

The radiation-to-electrical energy converter of this invention is simple, relatively inexpensive to make, and has no moving parts.

With the foregoing in mind a major object of this invention is to provide a novel radiation-to-electrical energy converter.

More particularly, it is an object of this invention to provide a novel radiation-to-electric current converter in which a pair of radiant energy absorbers are irradiated in such a manner to produce a useful alternating current.

A more specific object of this invention is to provide a novel radiation-to-electrical energy converter in which a pair of liquid crystals are employed as radiation gates and in which a circuit cyclically switches the states of the liquid crystals to alternately subject a pair of radiant energy absorbers to maximum radiation to produce an alternating current.

Still another object of this invention is to provide a novel radiation gate in the form of a specially constructed liquid crystal device having two states for alternately blocking and permitting passage of radiation rays.

These and other objects will appear as the description proceeds in conjunction with the appended claims and the annexed below-described drawings.

DETAILED DESCRIPTION

Figure 1:
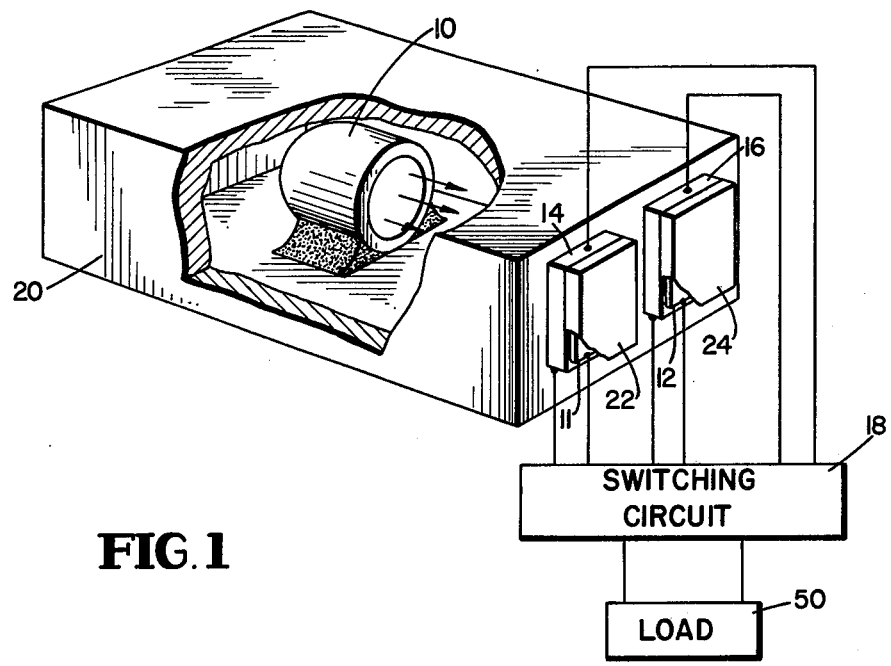
FIG. 1 is a partially schematic perspective view of the radiation-to-electrical energy converter according to a preferred embodiment of this invention.

Referring to the drawings, the radiant-to-electrical energy converter incorporating the principles of this invention is shown to comprise a source of radiation 10, a pair of radiant energy absorbers 11 and 12, a pair of liquid crystals 14 and 16 and an electrical circuit 18.

Any suitable source of radiation may be employed in this invention. It may be natural (sunlight) or artificial. Suitable artificial radiation sources include, but are not limited to, radioactive cobalt, uranium and plutonium. The type of radiation may be, by way of example, X-rays or gamma rays. Rays in and above the ultraviolet range are suitable.

Each of the absorbers 11 and 12 is made from any suitable electrically conductive material capable of absorbing radiant energy. Such material could be a solid, liquid or gas or combinations thereof. The material employed for absorbers 11 and 12 is preferably one that is capable of emitting a significant number of electrons upon being excited by a radiation source. Each of the absorbers 11 and 12 may be an electrically conductive metal plate as shown.

The type of radiation employed and the type of material used for absorbers 11 and 12 are required to be such that when absorbers are subjected to the radiation they acquire a positive potential or positive charge.

In this invention, crystals 14 and 16 are effective to transmit radiation rays in their clear state and to block transmission of the radiation rays in their cloudy or opaque state. Any suitable liquid crystal material may be employed such as anisylidene-para-aminophenylacetate.

Crystals 14 and 16 behave in the customary manner in and out of an electric field. Thus, crystals 14 and 16 are clear to permit transmission of the radiation rays when no voltage is applied and hence no current is passed through them. When a voltage is applied to pass current through the crystals, they change state to become cloudy or opaque and to thereby block transmission of the radiation rays.

The crystal material of each liquid crystal may be confined in an envelope or cell 19 which may consist of a pair of transparent plates between which the crystal material is sandwiched. The material employed to form the envelope of transparent plates is required to be quartz, zinc sulphide, or other suitable material which permits transmission of radiation rays. Glass is not an acceptable material because it reflects radiation in the mid ultra-violet range and above, including X-rays.

When an artificial radiation source, such as cobalt, is employed, it may be housed in a case or casing 200 (FIG. 1) which is advantageously made from lead or other suitable material for confining the radiation. Source 10 is positioned in casing 20 so that the radiation rays are directed at a pair of windows in which crystals 14 and 16 are suitably mounted in side-by-side relation as shown.

Absorber 11 is mounted behind crystal 14 so that crystal 14 is positioned between source 10 and absorber 11. Likewise, absorber 12 is mounted behind crystal 16 so that crystal 16 is positioned between source 10 and absorber 12.

When crystal 14 is in its clear state, it permits transmission of the radiation rays to absorber 11, and when crystal 14 is in its cloudy state, it blocks transmission of the radiation rays to absorber 11. Similarly, when crystal 16 is in its clear state it transmits the radiation rays to absorber 12, and when crystal 16 is in its cloudy or opaque state it blocks transmission of the radiation rays to absorber 12.

When the radiation rays strike absorbers 11 and 12, the absorber material is excited to emit electrons. The irradiated absorber therefore develops a deficiency of electrons and hence a positive electrical potential or charge.

Figure 2:
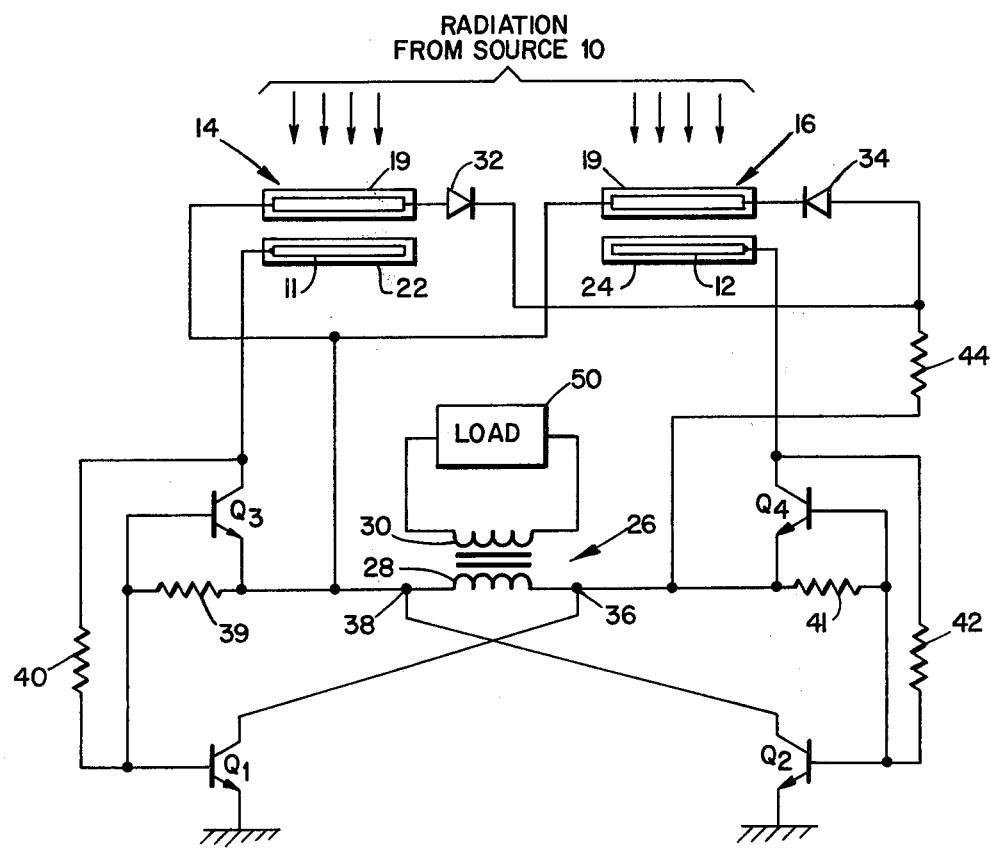
FIG. 2 is a schematic diagram of the switching circuit shown in FIG. 1.

Each of the absorbers 11 and 12 is electrically insulated and covered by a suitable electrical material such as mica. The insulating material may be in the form of an envelope as indicated at 22 and 24 in FIG. 2. The radiation rays penetrate the mica or other insulation and hence are not blocked by the insulation.

The electrons emitted by irradiating each of the absorbers 11 and 12 initially have a high enough velocity to penetrate through the insulation envelope. The emitted electrons escaping to exterior of envelopes 22 and 24 tend to be attracted by the positive potential developed on the absorber, but due to a reduction in their velocity, they are unable to re-penetrate the mica or other electrical insulation to neutralize the positive charge on the absorber.

In the illustrated embodiment, circuit 18 comprises a first pair of NPN switching transistors Q1 and Q3, a second pair of NPN switching transistors Q2 and Q4, a transformer 26 having primary and secondary windings 28 and 30, and a pair of semiconductor diodes 32 and 34. In this embodiment the output voltage produced by the converter is taken from the secondary of transformer 26.

Transistors Q1 and Q3 are connected in a TTL AND gate configuration. Transistors Q2 and Q4 are also connected in a TTL AND gate configuration. As is known, both transistor bases in each AND gate configuration are required to be forward biased or turned on in order to develop an output.

As shown, the bases of transistors Q1 and Q3 are tied (i.e., direct coupled) together. The collector of transistor Q1 is connected to one terminal of the transformer primary which is indicted at 36. The other transformer primary terminal, which is indicated at 38, is connected to the emitter of transistor Q3 and through a suitable resistance 39 to the bases of transistors Q1 and Q3. Absorber 11 is connected directly to the collector of transistor Q3 and is additionally connected through a current limiting resistor 40 to the bases of transistors Q1 and Q3. Resistance 39 is between the base and emitter of transistor Q3 as shown.

In a similar fashion, the bases of transistors Q2 and Q4 are tied together. The collector of transistor Q2 is connected to the transformer primary terminal 38. The other transformer primary terminal 36 is tied to the emitter of transistor Q4 and is additionally connected through a suitable resistance 41 to the bases of transistors Q2 and Q4. Resistance 41 is connected between the base and emitter of transistor Q4 as shown.

Absorber 12 is tied to the collector of transistor Q4 and is additionally connected through a current limiting resistor 42 to the bases of transistors Q2 and Q4.

The emitters of transistors Q1 and Q2 are returned to ground as shown to provide an electron source. Alternatively, the emitters of transistors Q1 and Q2 may be connected to suitable unshown antennas to provide an electron source. The alternative of a ground connection or an antenna is described in the previously mentioned Tesla patent.

Crystals 14 and 16 and diodes 32 and 34 together with a voltage dropping resistor 44 are connected in a portion of circuit 18 which is bridged or connected across the transformer primary terminals 36 and 38. Diode 32 is in series with crystal 14, and diode 34 is in series with crystal 16.

Thus, crystal 14, diode 32 and resistor 44 are connected in series across the transformer primary 28. Crystal 16, diode 34 and resistor 40 are also connected in series across the transformer primary as shown. With this circuit arrangement, the circuit branch containing crystal 14 and diode 32 is in parallel with the circuit branch containing crystal 16 and diode 34.

Diodes 32 and 34 are oppositely poled as shown so that for a given polarity of voltage across the transformer primary, one diode will be forward biased and the other diode will be reverse biased.

Before the supply of radiation from source 10 is initiated, transistors Q1 – Q4 are turned off and crystals 14 and 16 are clear. When the supply of radiation is initiated, therefore, positive potentials will be developed on both absorbers 11 and 12 to apply forward biasing voltages to both of the transistors Q1 and Q2.

However, the turn-on rate or turn-on time for transistors Q1 and Q2 will not be the same due primarily to differences between the junction capacitances of the transistors. Therefore, one transistor will turn on before the other, and for operation, it does not matter which transistor turns on first.

Assume that transistor Q1 turns on first. Transistor Q3 is therefore turned on. Sufficient forward bias is provided to operate transistors Q1 and Q3 at or close to saturation. By turning transistors Q1 and Q3 on, the bases of transistors Q2 and Q4 and the primary terminal 36 are taken to virtual ground. Transistors Q2 and Q4 are consequently driven into cutoff.

With transistors Q1 and Q3 turned on and transistors Q2 and Q4 turned off, current will flow in a first direction through primary 28, and the potential at terminal 38 will be positive relative to the potential at terminal 36. The current flow through primary 28 induces a voltage of one polarity in the secondary of transformer 26 so that current will flow in a load 50 which is connected in the transformer's secondary circuit.

Since the potential developed across primary 28 is impressed across the two circuit branches containing diodes 32 and 34, diode 32 will be forward biased and diode 34 will be reverse biased when transistors Q1 and Q3 are conducting and transistors Q2 and Q4 are off. Current therefore flows through crystal 14, but not crystal 16. Crystal 14 therefore begins to turn cloudy while crystal 16 remains clear to continue to irradiate absorber 12.

As the cloudiness of crystal 14 increases, the amount of radiation passed or transmitted by crystal 14 to absorber 11 decreases. The positive potential on absorber 11 therefore decreases, and when it reduces enough, it removes the forward bias from transistors Q1 and Q3. Transistors Q1 and Q3 therefore turn off to remove the ground from terminal 36 and from the bases of transistors Q2 and Q4. Until the forward bias on transistors Q1 and Q3 is reduced sufficiently to turn transistors Q1 and Q3 off, collector current will continue to flow through primary 28.

When the ground is removed from the bases of transistors Q2 and Q4 by turning transistors Q1 and Q3 off, transistors Q2 and Q4 will be biased into conduction to operate at or close to saturation as a result of the positive potential developed on absorber 12 by the clear state of crystal 16.

By turning transistors Q2 and Q4 on, the bases of transistors Q1 and Q3 and primary terminal 38 are taken to virtual ground, and Q2 collector current will flow through primary 28. This primary current flow will be in a direction which is opposite to the current flow which existed when transistors Q1 and Q3 were conducting. Flow of alternating current is therefore established in the primary winding 28 to induce an a.c. voltage in the transformer's secondary. Alternating current consequently flows through the load 50 which is across the secondary winding 30.

In the second half of the operating cycle in which transistors Q2 and Q4 are turned on and transistors Q1 and Q3 are turned off, the potential at the primary terminal 38 will be positive with respect to the potential at terminal 36. Diode 34 will therefore be forward biased and diode 32 will be reverse biased so that current will now flow through crystal 16, but not crystal 14.

Crystal 16 therefore begins to change states from clear to cloudy to begin to block transmission of the radiation rays from source 10. At the same time, crystal 14 begins to change states from cloudy to clear because current flow through crystal 14 is blocked. When crystal 14 clears sufficiently to permit passage of radiation rays to absorber 11, a positive potential is again developed on absorber 11, but as long as transistor Q2 and Q4 are conducting, transistors Q1 and Q3 will remain off.

By passing current through crystal 16, crystal 16, after an elapse of a predetermined time, will become sufficiently cloudy to block transmission of radiation to absorber 12. The positive potential on absorber 12 therefore reduces after this elapse of time to lower the transistor foward biasing voltage sufficiently to turn transistors Q2 and Q4 off.

By turning transistors Q2 and Q4 off, the ground from the bases of transistors Q1 and Q3 will be removed. Now, the positive voltage on absorber 11 will cause transistors Q1 and Q3 to again turn on to repeat the previously described cycle.

Thus, with transistors Q1 and Q3 turned on once again, the bases of transistors Q2 and Q4 are again taken to ground, Q1 current will once again flow through the primary of transformer 26 and current will again flow through crystal 14, but not crystal 16. Crystal 16 will therefore change from its cloudy state to its clear state to permit passage of radiation for irradiating absorber 12 while crystal 14 is again turning cloudy to block the transmission of radiation to absorber 11. Transistors Q2 and Q4 will not be turned on by the resulting positive potential developed on absorber 11 because the bases of transistor Q2 and Q4 have been taken to ground.

From the foregoing description it will be appreciated that the converter of this invention produces a continuous flow of alternating current in the transformer primary 28 with the result that alternating current will continuously flow through load 50. When transistors Q1 and Q3 are on and transistors Q2 and Q4 are off, a voltage of one polarity is induced in the transformer secondary, and when switching takes place to turn transistors Q1 and Q3 off and to turn transistors Q2 and Q4 on, a voltage of opposite polarity will be induced in the secondary. The frequency of current and voltage thus produced is set by the time required to change the state of each liquid crystal.

Thus, crystals 14 and 16 alternate between their transparent and opaque or cloudy states under the control of transistors Q1 - Q4. In this respect, it will be appreciated that two switching circuits are defined, one by transistors Q1 and Q3 and the other by transistors Q2 and Q3. These switching circuits isolate absorbers 11 and 12 from the alternating potential across the transformer primary. Additionally, these switching circuits take one of the primary to ground in one half cycle and the other side to ground in the other half cycle.

A different load may be employed in place of transformer if desired. It will be appreciated that circuit 18 is self-starting, simple and inexpensive to manufacture. Other circuits, however, may be employed to accomplish the desired functions. Additionally, switching devices other than junction transistors may be employed.

If direct current is desired, a rectifier may be connected to transformer 26 which may be a step down, step up or in a 1 to 1 turns ratio. Additionally, transfer of power to a load may be accomplished by devices other than a transformer.

To provide equal positive and negative half cycles of alternating current flow crystals 14 and 16 should be matched, for the time required for them to change states sets the frequency of the induced voltage. In this respect, strips of liquid crystal could be applied across absorbers 11 and 12 to produce a faster operating time.

From the foregoing description it is clear that circuit 18 controls the states of crystals 14 and 16 and employs the positive potentials developed on absorbers 11 and 12 to establish an alternating current. It also is clear that absorbers 11 and 12 are alternately subjected to maximum radiation because of the alternate states of crystals 14 and 16. In one half of the operating cycle as described above, the irradiation of absorber 11 is decreasing while the irradiation of absorber 12 is increasing. In the succeeding half cycle, the irradiation of absorber 12 is decreasing while the irradiation of absorber 11 is increasing. When maximum radiation is applied to absorber 11, transmission of radiation to absorber 12 is blocked, and when maximum radiation is applied to absorber 12, transmission of radiation to absorber 11 is blocked.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by Letters Patent is:

1. A radiation-to-electrical energy converter adapted for use with a radiation source and comprising a pair of radiant energy absorbers, and means for producing an alternating current by alternately irradiating said absorbers to predetermined levels with radiation furnished by said source.

2. A radiation-to-electrical energy converter adapted for use with a radiation source and comprising a pair of radiant energy absorbers, and means controlling the irradiation of said absorbers with radiation furnished by said source to establish flow of an alternating current in an impedance.

3. A radiation-to-electrical energy converter adapted for use with a radiation source and comprising a pair of radiant energy absorbers each effective to develop a positive potential upon being irradiated by said source, and means (a) controlling transmission of radiation from said source to said absorbers to alternate the build up of positive potentials on said absorbers and (b) employing the positive potentials to produce an alternating current.

4. A radiation-to-electrical energy converter adapted for use with a radiation source and comprising a pair of radiant energy absorbers each effective to develop a positive potential upon being irradiated and both arranged in the path of radiation from said source, a pair of energizable radiation gates each having a first state when energized and a second state when un-energized, each gate being effective to transmit radiation in one of said first and second states and to block transmission in the other of said first and second states, one of said gates being arranged in the radiation path between said source and one of said absorbers to control transmission of radiation from the source to said one of said absorbers, and the other of said gates being arranged in the radiation path between said source and the other of said absorbers to control the transmission of radiation from said source to the other of said absorbers, and circuit means connected to said absorbers and said gates to alternately energize said gates and to employ the positive potentials developed on said absorbers for producing an alternating current.

5. A radiation-to-electrical energy converter adapted for use with a radiation source and comprising first and second radiant energy absorbers each positioned in the path of radiation from said source and each effective to develop a positive potential upon being irradiated by said source, first and second liquid crystals, each of said crystals being clear in an un-energized state to pass radiation and opaque in an energized state to block transmission of radiation, said first crystal being arranged in the radiation path between said first absorber and source to control transmission of radiation from said source to said first absorber, and said second crystal being positioned in the radiation path between said second absorber and said source to control the transmission of radiation from said source to said second absorber, and circuit means electrically connected to said crystals and said absorbers for alternately energizing said crystals and employing the positive potentials developed on said absorbers to produce an alternating current.

6. The radiation-to-electrical energy converter defined in claim 5 wherein said circuit means comprises first and second switching circuits and an impedance, said first switching circuit being switched to a non-conducting state in response to a predetermined reduction of positive potential on said first absorber, said second switching circuit being switched to a non-conducting state in response to a predetermined reduction of positive potential on said second absorber, said first switching circuit being responsive to a positive potential of predetermined value on said first absorber when said second switching circuit is in its non-conducting state to establish flow of current through said impedance in one pre-selected direction and to energize said first crystal to block transmission of radiation to said first absorber and thereby reduce the positive potential on said first absorber, and said second switching circuit being responsive to a positive potential of predetermined value on said second absorber when said first switching circuit is in its non-conducting state to establish flow of current through said impedance in the direction which is opposite to said one pre-selected direction and to energize said second crystal to block transmission of radiation to said second absorber and thereby reduce the positive potential on said second absorber, and said circuit means further including means preventing energization of said first crystal by said second switching circuit and preventing energization of said second crystal by said first switching circuit, and the positive potentials developed on each of said absorbers by irradiation from said source being at least equal to said predetermined value.

7. A radiation gate comprising a liquid crystal material which is effective to change states from clear to cloudy upon being energized by an electrical current and which is effective to pass radiation in its clear state and to block radiation in its cloudy state, and a cell receiving said material, said cell being formed from a material which is transparent to radiation in a frequency range which would otherwise be reflected by glass.

* * * * *